United States Patent
Mori

(10) Patent No.: US 10,340,338 B2
(45) Date of Patent: Jul. 2, 2019

(54) SEMICONDUCTOR DEVICE

(71) Applicant: Renesas Electronics Corporation, Koutou-ku, Tokyo (JP)

(72) Inventor: Takahiro Mori, Hitachinaka (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/810,011

(22) Filed: Nov. 11, 2017

(65) Prior Publication Data

US 2018/0145132 A1    May 24, 2018

(30) Foreign Application Priority Data

Nov. 21, 2016   (JP) .................................. 2016-226026

(51) Int. Cl.
*H01L 29/06* (2006.01)
*H01L 21/762* (2006.01)
*H01L 29/66* (2006.01)
*H01L 29/78* (2006.01)
(Continued)

(52) U.S. Cl.
CPC .... *H01L 29/0649* (2013.01); *H01L 21/76224* (2013.01); *H01L 29/0619* (2013.01); *H01L 29/0653* (2013.01); *H01L 29/0692* (2013.01); *H01L 29/66659* (2013.01); *H01L 29/66689* (2013.01); *H01L 29/7816* (2013.01); *H01L 29/7835* (2013.01); *H01L 29/402* (2013.01); *H01L 29/4238* (2013.01)

(58) Field of Classification Search
CPC ........... H01L 29/0649; H01L 21/76224; H01L 29/7816; H01L 29/66689
See application file for complete search history.

(56) References Cited

U.S. PATENT DOCUMENTS

| 10,008,489 B2 * | 6/2018 | Huang ................. H01L 27/0255 |
| 2008/0237634 A1 * | 10/2008 | Dyer ............... H01L 21/823412 257/190 |
| 2011/0215401 A1 | 9/2011 | Miyakoshi et al. |

(Continued)

FOREIGN PATENT DOCUMENTS

| EP | 3 076 425 A1 | 10/2016 |
| EP | 3 136 441 A1 | 3/2017 |

(Continued)

OTHER PUBLICATIONS

Extended European Search Report dated Apr. 6, 2018, in European Patent Application No. 17201514.1.

*Primary Examiner* — Dung A. Le
(74) *Attorney, Agent, or Firm* — Shapiro, Gabor and Rosenberger, PLLC

(57) ABSTRACT

A semiconductor device according to one embodiment includes a semiconductor substrate having a first surface, an insulating isolation structure having a first depth, and a gate electrode. The semiconductor substrate has source and drain regions, a reverse conductivity region having a second depth, a body region, and a drift region. The source region, the drift region, and the drain region are of a first conductivity type, and the body region and the reverse conductivity region are of a second conductivity type which is opposite to the first conductivity type. The insulating isolation structure is disposed between the drain region and the reverse conductivity region. The first depth is larger than the second depth.

10 Claims, 13 Drawing Sheets

(51) Int. Cl.
*H01L 29/40* (2006.01)
*H01L 29/423* (2006.01)

(56) References Cited

U.S. PATENT DOCUMENTS

| | | | |
|---|---|---|---|
| 2013/0187226 A1* | 7/2013 | Park | H01L 29/402 257/343 |
| 2013/0334600 A1 | 12/2013 | Hsu et al. | |
| 2014/0054694 A1 | 2/2014 | Min et al. | |
| 2016/0284801 A1 | 9/2016 | Mori | |
| 2017/0062608 A1 | 3/2017 | Mori | |

FOREIGN PATENT DOCUMENTS

| JP | 2009-130021 A | 6/2009 |
|---|---|---|
| JP | 2011-181709 A | 9/2011 |
| JP | 2014-107302 A | 6/2014 |
| JP | 2015-023208 A | 2/2015 |

\* cited by examiner

SEMICONDUCTOR DEVICE

This nonprovisional application is based on Japanese Patent Application No. 2016-226026 filed on Nov. 21, 2016, with the Japan Patent Office, the entire contents of which are hereby incorporated by reference.

BACKGROUND OF THE INVENTION

Field of the Invention

The present invention relates to a semiconductor device and a method for manufacturing the same.

Description of the Background Art

As a structure of an LDMOS (Laterally Double-diffused Metal Oxide Semiconductor) transistor, a structure described in Japanese Patent Laying-Open No. 2009-130021 is known.

The LDMOS transistor described in patent document 1 has a substrate, an n− active layer, an n− drift layer, a p− body diffusion layer, an n+ drain region, an n+ source region, a p+ diffusion layer, a gate oxide layer, a gate polycide electrode, and a LOCOS (Local Oxidation Of Silicon) oxide film.

The substrate has a first surface and a second surface. The n− drift layer and the p− body diffusion layer are disposed on the n− active layer. The p− body diffusion layer is sandwiched by the n+ source region and the n− drift region. The n+ drain region is disposed in the n− drift region in contact with the first surface. The n+ source region is disposed in the p− body region in contact with the first surface. The p+ diffusion layer is disposed in the n− drift region in contact with the first surface.

The LOCOS oxide film is disposed between the p+ diffusion layer and the n+ drain region. The p+ diffusion layer is formed toward the second surface to reach a position deeper than the LOCOS oxide film. The gate oxide layer is disposed on the first surface between the p+ diffusion layer and the n+ source region. The gate polycide electrode is disposed on the gate oxide layer.

As structures of other LDMOSFETs, structures described in Japanese Patent Laying-Open Nos. 2011-181709, 2014-107302, and 2015-023208 are known.

SUMMARY OF THE INVENTION

When the LDMOS transistor described in Patent Document 1 is in an on state, a current flows from the n+ drain region toward the n+ source region. This current passes directly under the LOCOS oxide film. As has been set forth above, the p+ diffusion layer is formed to reach a position deeper than the LOCOS oxide film, and accordingly, the p+ diffusion layer will be located on a path of this current.

As a result, this current's flow is prevented by the p+ diffusion layer and the amount of the current decreases. Other issues and novel features will be apparent from the description of this specification and the accompanying drawings.

A semiconductor device according to one embodiment comprises a semiconductor substrate having a first surface, a gate electrode, and an insulating isolation structure. The semiconductor substrate has a drift region, a source region, a drain region, a body region, and a reverse conductivity region. The drift region, the source region, and the drain region are of a first conductivity type. The body region and the reverse conductivity region are of a second conductivity type. The second conductivity type is a conductivity type opposite to the first conductivity type.

The source region is disposed in contact with the first surface. The drain region is disposed in contact with the first surface. The reverse conductivity region is disposed in contact with the first surface. The body region is disposed in contact with the first surface so as to surround the source region. The drift region is disposed in contact with the first surface so as to surround the drain region and the reverse conductivity region and sandwich the body region between the source region and the drift region.

The insulating isolation structure is composed of an insulator. The insulating isolation structure is disposed at a side of the first surface between the drain region and the reverse conductivity region. The insulating isolation structure has a first depth. The reverse conductivity region has a second depth. The first depth is larger than the second depth. The gate electrode faces and is insulated from a portion of the body region which is sandwiched by the source region and the drift region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments will be described with reference to the drawings. In the figures, identical or corresponding components are identically denoted and will not be described repeatedly.

(First Embodiment)

Figure 1:
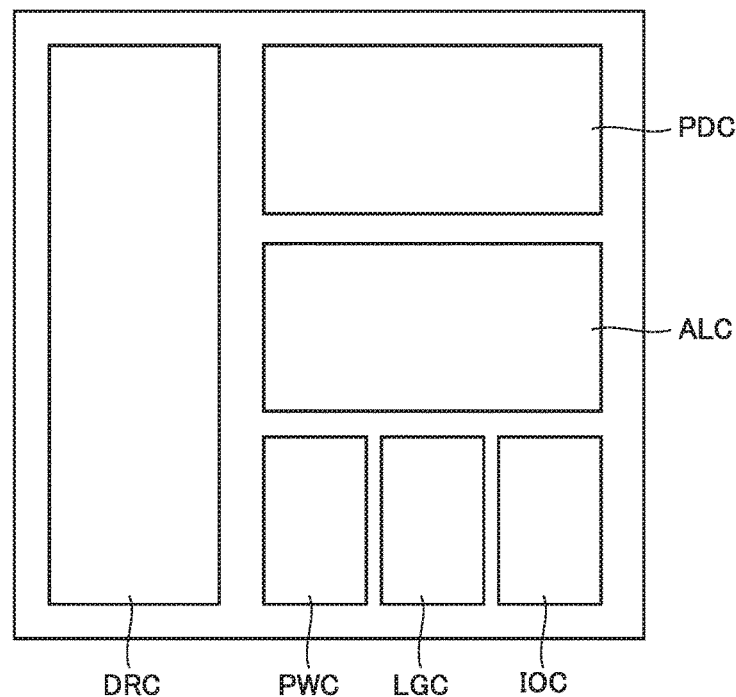
FIG. 1 is a block diagram generally showing a structure of a semiconductor device according to a first embodiment.

Hereinafter, a configuration of a semiconductor device according to a first embodiment will be described. As shown in FIG. 1, the semiconductor device according to the first embodiment has a driver circuit DRC, a predriver circuit PDC, an analog circuit ALC, a power supply circuit PWC, a logic circuit LGC, and an input/output circuit IOC, for example. The semiconductor device according to the first embodiment is a semiconductor device in which, for example, a bipolar transistor, a CMOS (Complementary Metal Oxide Semiconductor) transistor, and an LDMOS transistor are mounted in a mixed manner.

Figure 2:
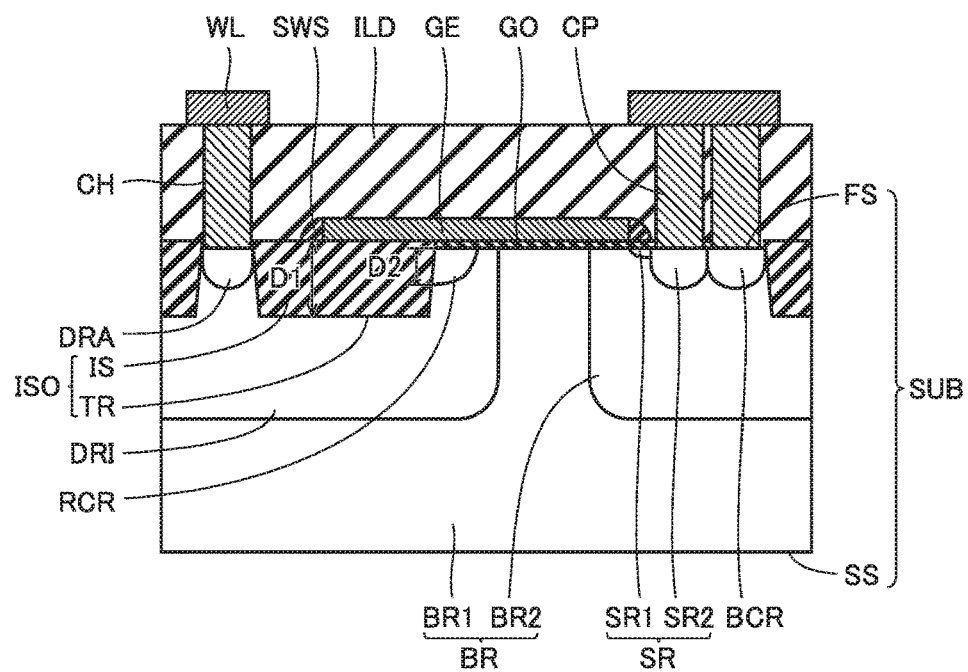
FIG. 2 is a cross-sectional view of the semiconductor device according to the first embodiment.

As shown in FIG. 2, the semiconductor device according to the first embodiment has a LDMOS transistor in input/output circuit IOC, for example. More specifically, the semiconductor device according to the first embodiment has a semiconductor substrate SUB, an insulating isolation structure ISO, a gate insulating film GO, a gate electrode GE, an interlayer insulating film ILD, a contact plug CP, and a wiring WL in input/output circuit IOC.

Semiconductor substrate SUB is formed for example of a single crystal of silicon (Si). Note, however, that semiconductor substrate SUB is not limited in material thereto. For semiconductor substrate SUB, a wide band gap semiconductor material such as gallium nitride (GaN) or the like can also be used. Semiconductor substrate SUB has a first surface FS and a second surface SS. First surface FS has a trench TR. Trench TR extends toward second surface SS. Second surface SS is a surface opposite to first surface FS.

Semiconductor substrate SUB has a source region SR, a drain region DRA, and a reverse conductivity region RCR. Source region SR is provided in semiconductor substrate SUB in contact with first surface FS. Source region SR may have a first portion SR1 and a second portion SR2. First portion SR1 is disposed adjacent to second portion SR2 and below a sidewall spacer SWS described later. First portion SR1 has an LDD (Lightly Doped Drain) structure. Drain region DRA is provided in semiconductor substrate SUB in contact with first surface FS. Reverse conductivity region RCR is provided in semiconductor substrate SUB in contact with first surface FS.

The semiconductor substrate may further have a body contact region BCR. Body contact region BCR is disposed in semiconductor substrate SUB in contact with first surface FS.

Semiconductor substrate SUB further has a drift region DRI and a body region BR. Drift region DRI is disposed so as to surround drain region DRA and reverse conductivity region RCR. Drift region DRI is disposed in contact with first surface FS.

Body region BR is formed so as to surround source region SR and body contact region BCR. Body region BR is disposed in contact with first surface FS. Body region BR has a portion sandwiched between drift region DRI and source region SR. The portion of body region BR sandwiched between drift region DRI and source region SR serves as a channel region.

Body region BR may have a first portion BR1 and a second portion BR2. Second portion BR2 is disposed so as to surround source region SR and body contact region BCR. Second portion BR2 is disposed in contact with first surface FS. First portion BR1 is disposed so as to surround second portion BR2.

Source region SR, drift region DRI, and drain region DRA have a first conductivity type. Body region BR, reverse conductivity region RCR, and body contact region BCR have a second conductivity type. The second conductivity type is a conductivity type opposite to the first conductivity type. When the first conductivity type is for example a p type, the second conductivity type will be an n type. When the first conductivity type is for example the n type, the second conductivity type will be the p type.

Source region SR and drain region DRA preferably have an impurity concentration higher than that of drift region DRI. Reverse conductivity region RCR has an impurity concentration higher than that of drift region DRI. Reverse conductivity region RCR preferably has an impurity concentration equal to or greater than 10 times that of drift region DRI. Note that second portion SR2 preferably has an impurity concentration higher than that of first portion SR1.

Insulating isolation structure ISO is disposed on a side of first surface FS of semiconductor substrate SUB. Insulating isolation structure ISO is disposed between drain region DRA and reverse conductivity region RCR. Insulating isolation structure ISO is preferably composed of trench TR and an insulator IS. From another point of view, insulating isolation structure ISO is preferably STI (Shallow Trench Isolation). However, insulating isolation structure ISO is not limited to STI. For example, insulating isolation structure ISO may be LOCOS.

Trench TR is disposed between drain region DRA and reverse conductivity region RCR. Insulator IS fills trench TR. Insulator IS is composed for example of silicon dioxide ($SiO_2$).

Insulating isolation structure ISO has a first depth D1. From another point of view, trench TR has first depth D1. Reverse conductivity region RCR has a second depth D2. First depth D1 and second depth D2 are each a depth in a direction from first surface FS toward second surface SS. First depth D1 is larger than second depth D2. More preferably, second depth D2 is equal to or greater than first depth D1 multiplied by 0.3 and equal to or less than first depth D1 multiplied by 0.7.

Gate insulating film GO is provided on first surface FS. Gate insulating film GO is disposed on a portion of body region BR sandwiched between source region SR and drift region DRI (i.e., the channel region). Gate insulating film GO is composed for example of $SiO_2$.

Gate electrode GE is formed on gate insulating film GO. Gate electrode GE may extend to reach insulating isolation structure ISO. Gate electrode GE faces and is insulated from the portion of body region BR which is sandwiched by source region SR and drift region DRI (i.e., the channel region). Gate electrode GE and the portion of body region BR sandwiched between source region SR and the drift region are insulated by gate insulating film GO. Gate electrode GE is composed for example of polycrystalline Si doped with impurity. Gate electrode GE may have opposite ends provided with sidewall spacer SWS. Sidewall spacer SWS is composed for example of $SiO_2$.

Interlayer insulating film ILD is disposed on first surface FS. Interlayer insulating film ILD is composed for example of $SiO_2$. Interlayer insulating film ILD has a contact hole CH. Contact hole CH penetrates interlayer insulating film ILD toward first surface FS. Contact hole CH is disposed on source region SR, drain region DRA, and body contact region BCR. In other words, source region SR, drain region DRA, and body contact region BCR are exposed from interlayer insulating film ILD through contact hole CH. Note that although it is not shown, contact hole CH is also disposed on gate electrode GE and gate electrode GE is exposed from interlayer insulating film ILD through contact hole CH.

Contact plug CP is disposed in interlayer insulating film ILD. More specifically, contact plug CP is disposed in contact hole CH. Contact plug CP has one end electrically connected to source region SR, drain region DRA, and body contact region BCR. Although it is not shown, contact plug CP has one end electrically connected to gate electrode GE. Contact plug CP is composed for example of tungsten (W).

Wiring WL is disposed on interlayer insulating film ILD. Wiring WL is electrically connected to the other end of contact plug CP. As a result, wiring WL is electrically connected to source region SR, drain region DRA, body contact region BCR, and gate electrode GE.

Figure 3:
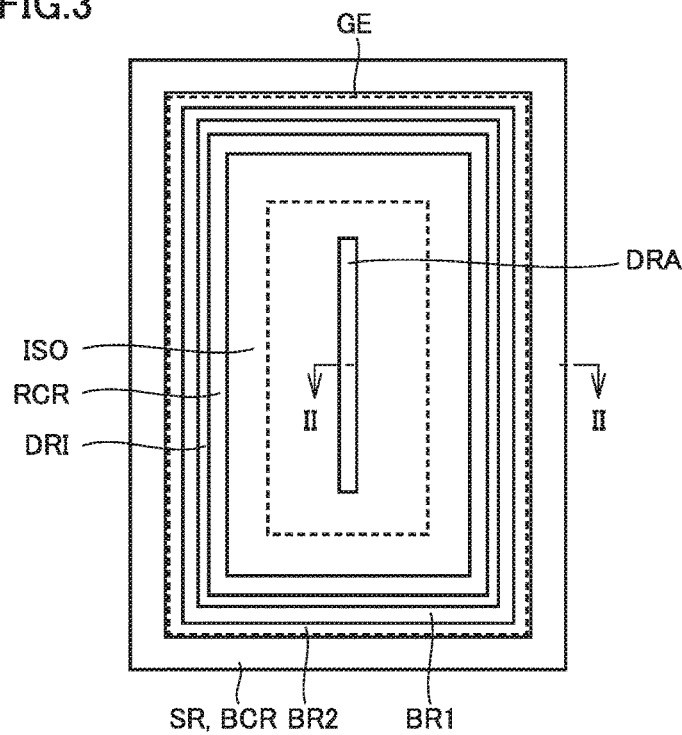
FIG. 3 is a top view of the semiconductor device according to the first embodiment.

As shown in FIG. 3 (in FIG. 3, gate insulating film GO, interlayer insulating film ILD, contact plug CP and wiring WL are not shown for the sake of simplicity), drain region DRA is surrounded by insulating isolation structure ISO in a plan view (as viewed in a direction perpendicular to first plane FS). Reverse conductivity region RCR is disposed so as to surround insulating isolation structure ISO in a plan view.

Drift region DRI is disposed so as to surround drain region DRA, insulating isolation structure ISO, and reverse conductivity region RCR in a plan view. Body region BR is disposed so as to surround drift region DRI in a plan view. Source region SR and body contact region BCR are disposed so as to surround drain region DRA, insulating isolation structure ISO, and reverse conductivity region RCR in body region BR in a plan view.

Gate electrode GE is disposed so as to overlap insulating isolation structure ISO, reverse conductivity region RCR and body region BR in a plan view. Gate electrode GE is disposed inside source region SR and body contact region BCR in a plan view.

Figure 4:
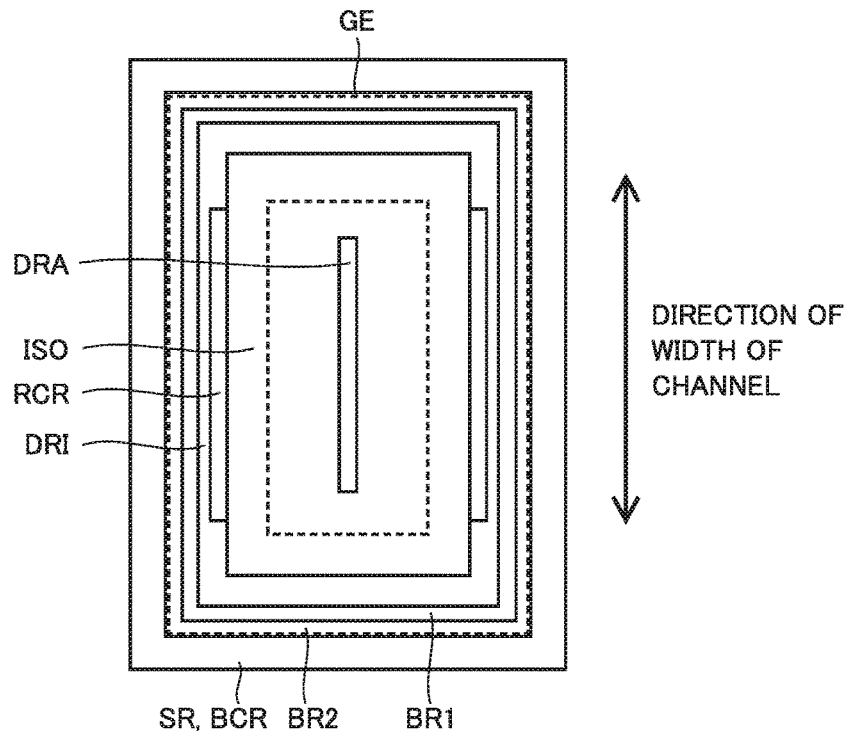
FIG. 4 is a top view of a semiconductor device according to a first exemplary variation of the first embodiment.

As shown in FIG. 4 (in FIG. 4, gate insulating film GO, interlayer insulating film ILD, contact plug CP and wiring WL are not shown for the sake of simplicity), reverse conductivity region RCR may not be disposed so as to surround insulating isolation structure ISO. Reverse conductivity region RCR is only required to be disposed in the direction of the width of the channel, which is indicated by an arrow in FIG. 4) in a plan view. In other words, reverse conductivity region RCR may not be provided in a direction orthogonal to the direction of the width of the channel in a plan view.

Figure 5:
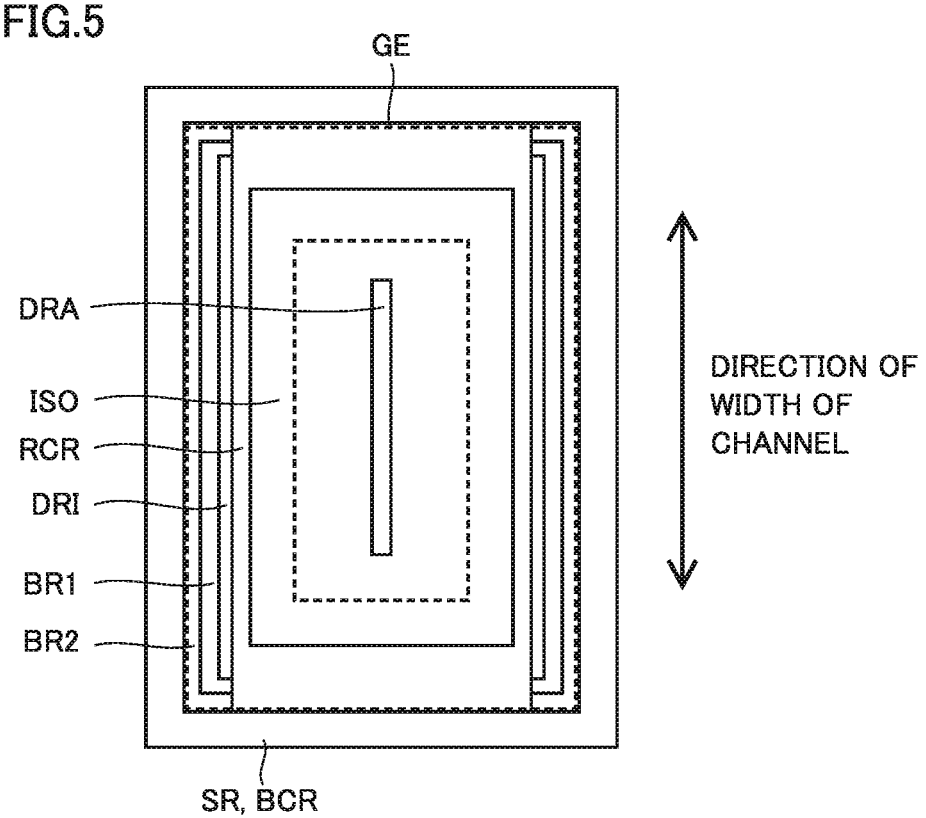
FIG. 5 is a top view of a semiconductor device according to a second exemplary variation of the first embodiment.

As shown in FIG. 5 (in FIG. 5, for the sake of simplicity, gate insulating film GO, interlayer insulating film ILD, contact plug CP and wiring WL are not shown), reverse conductivity region RCR may extend in a direction in which the channel extends so that reverse conductivity region RCR reaches body region BR in a plan view. Thus, reverse conductivity region RCR is equal in potential to source region SR and body contact region BCR.

Hereinafter, a method for manufacturing a semiconductor device according to the first embodiment will be described.

Figure 6:
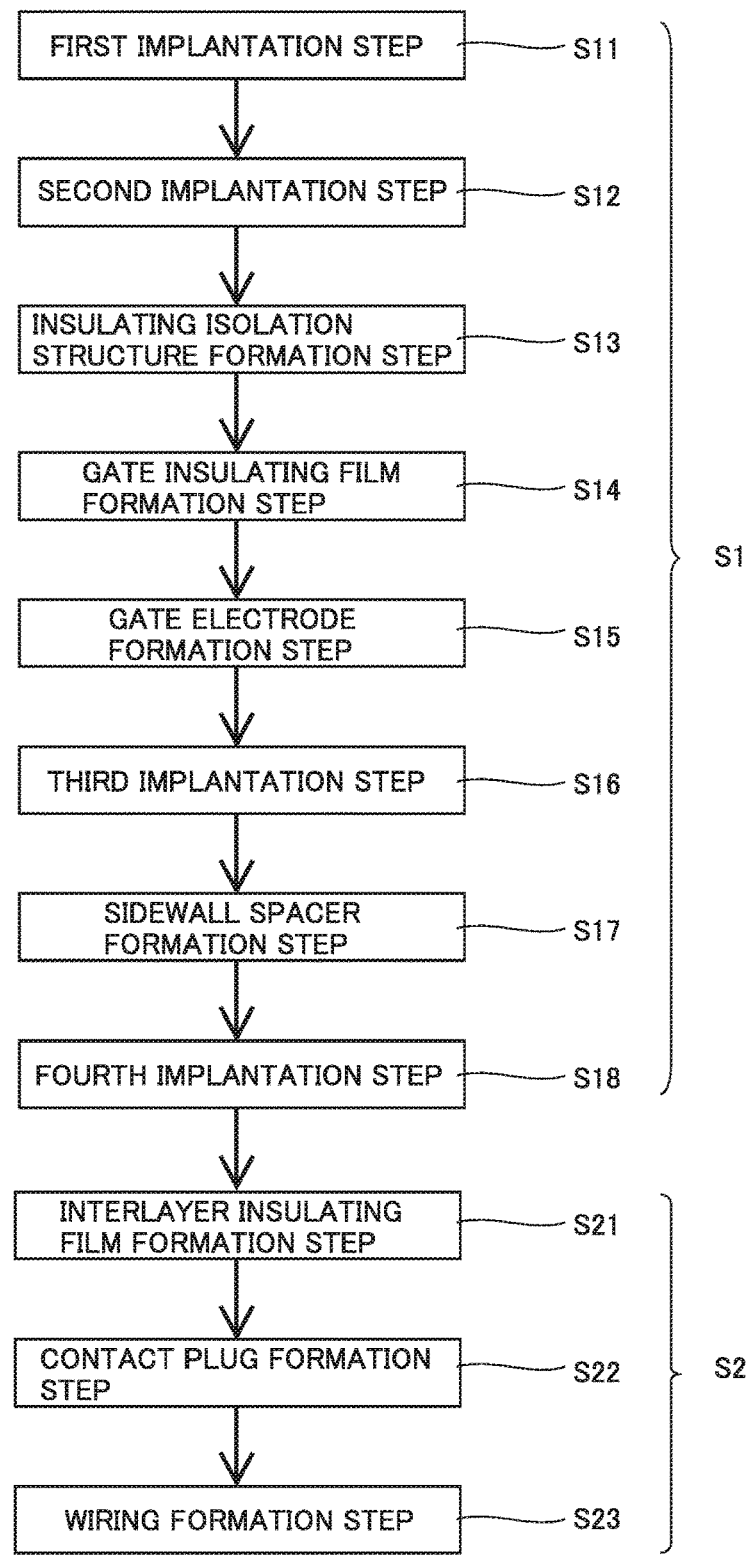
FIG. 6 is a process diagram showing a method for manufacturing the semiconductor device according to the first embodiment.

As shown in FIG. 6, the method for manufacturing a semiconductor device according to the first embodiment has a front end step S1 and a back end step S2.

Front end step S1 has a first implantation step S11, a second implantation step S12, an insulating isolation structure formation step S13, a gate insulating film formation step S14, a gate electrode formation step S15, a third implantation step S16, a sidewall spacer formation step S17, and a fourth implantation step S18.

Back end step S2 has an interlayer insulating film formation step S21, a contact plug formation step S22, and a wiring formation step S23.

Figure 7:
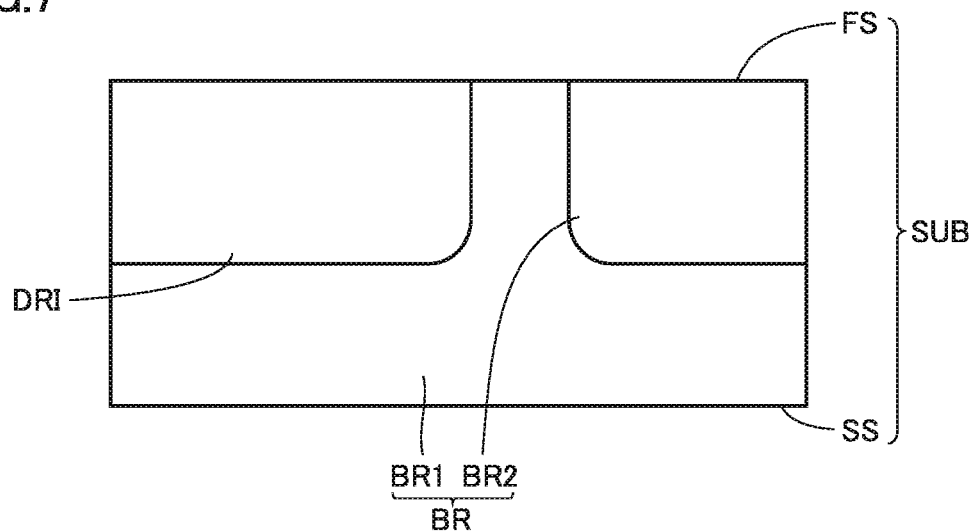
FIG. 7 is a cross-sectional view of the semiconductor device according to the first embodiment in a first implantation step.

As shown in FIG. 7, in first implantation step S11, body region BR and drift region DRI are formed. More specifically, in first implantation step S11, ion implantation is performed from the side of the first surface of semiconductor substrate SUB having the second conductivity type to a position which will be drift region DRI and a position which will be second portion BR2, to form drift region DRI and second portion BR2. Note that a portion which does not become drift region DRI or second portion BR2 by the ion implantation will be first portion BR1.

Figure 8:
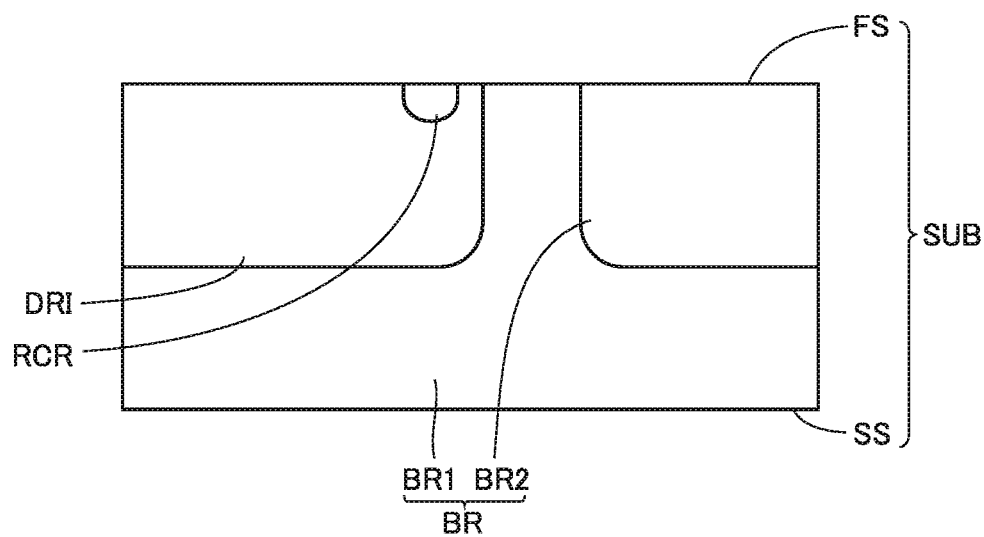
FIG. 8 is a cross-sectional view of the semiconductor device according to the first embodiment in a second implantation step.

As shown in FIG. 8, in second implantation step S12, reverse conductivity region RCR is formed. Reverse conductivity region RCR is formed for example by ion implantation with photoresist used as a mask.

Figure 9:
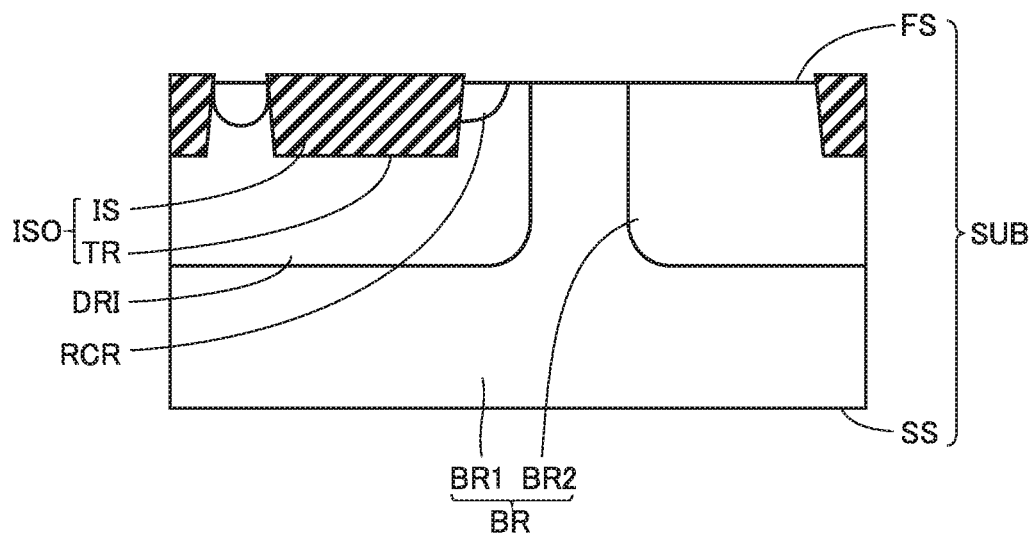
FIG. 9 is a cross-sectional view of the semiconductor device according to the first embodiment in an insulating isolation structure formation step.

As shown in FIG. 9, in insulating isolation structure formation step S13, insulating isolation structure ISO is formed. Insulating isolation structure formation step S13 for example has a trench formation step S131 and an insulator introduction step S132. In trench formation step S131, trench TR is formed in semiconductor substrate SUB at first surface FS. Trench TR is formed for example by anisotropic etching such as RIE (Reactive Ion Etching).

Insulator introduction step S132 is performed after trench formation step S131. In insulator introduction step S132, insulator IS is introduced into and thus fills trench TR. Insulator IS is introduced into trench TR for example by CVD (Chemical Vapor Deposition). In introducing insulator IS into trench TR, insulator IS protruding from trench TR is removed by CMP (Chemical Mechanical Polishing) or the like.

Figure 10:
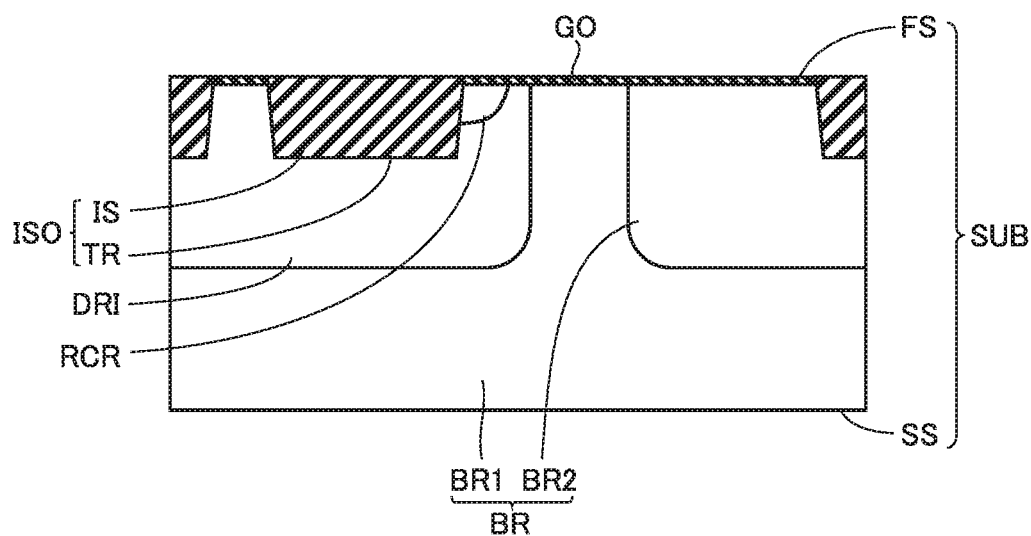
FIG. 10 is a cross-sectional view of the semiconductor device according to the first embodiment in a gate insulating film formation step.

As shown in FIG. 10, in gate insulating film formation step S14, gate insulating film GO is formed. Gate insulating film GO is provided for example by thermally oxidizing first surface FS of semiconductor substrate SUB.

Figure 11:
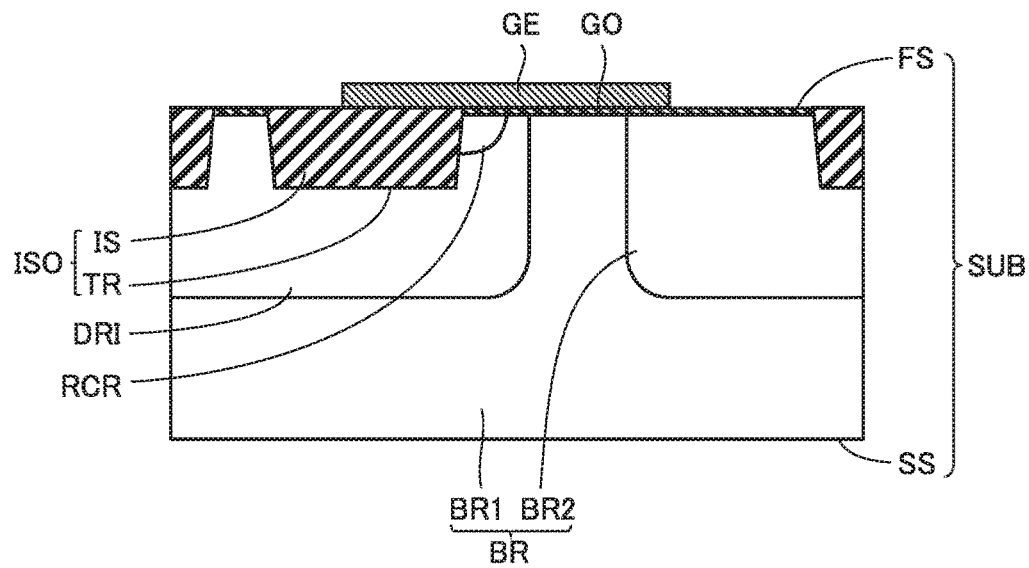
FIG. 11 is a cross-sectional view of the semiconductor device according to the first embodiment in a gate electrode formation step.

As shown in FIG. 11, in gate electrode formation step S15, gate electrode GE is formed. Gate electrode formation step S15 has a deposition step S151 and a patterning step S152, for example. In deposition step S151, a material, such as polycrystalline Si, which composes gate electrodes GE, is deposited on gate insulating film GO. This deposition is done for example by CVD.

Patterning step S152 is performed after deposition step S151. In patterning step S152, the material deposited on gate insulating film GO and composing gate electrodes GE is patterned. This patterning is done through photolithography for example.

Figure 12:
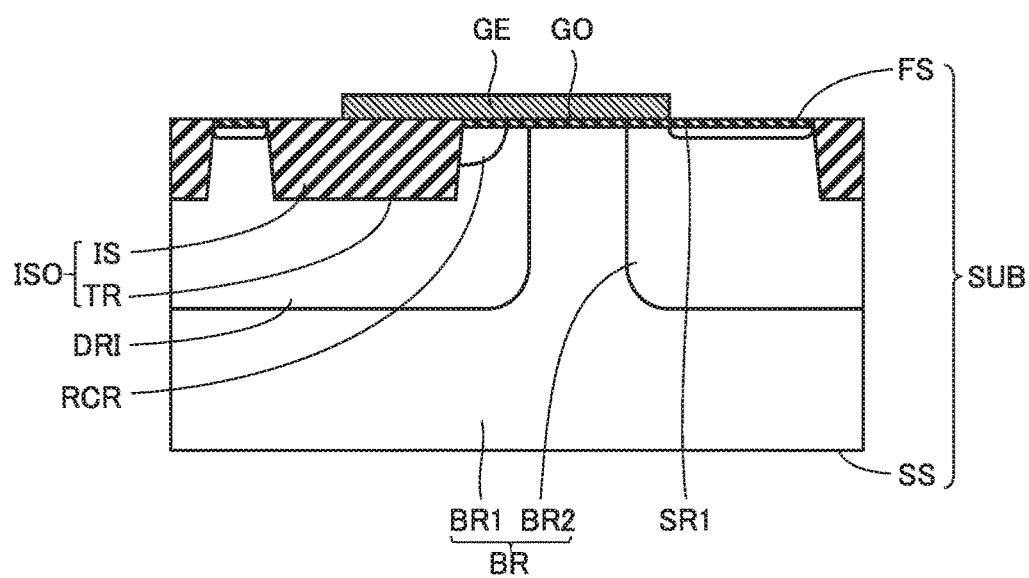
FIG. 12 is a cross-sectional view of the semiconductor device according to the first embodiment in a third implantation step.

As shown in FIG. 12, in third implantation step S16, first portion SR1 is formed. First portion SR1 is formed by ion implantation. This ion implantation is performed with gate electrode GE and insulating isolation structure ISO used as a mask.

Figure 13:
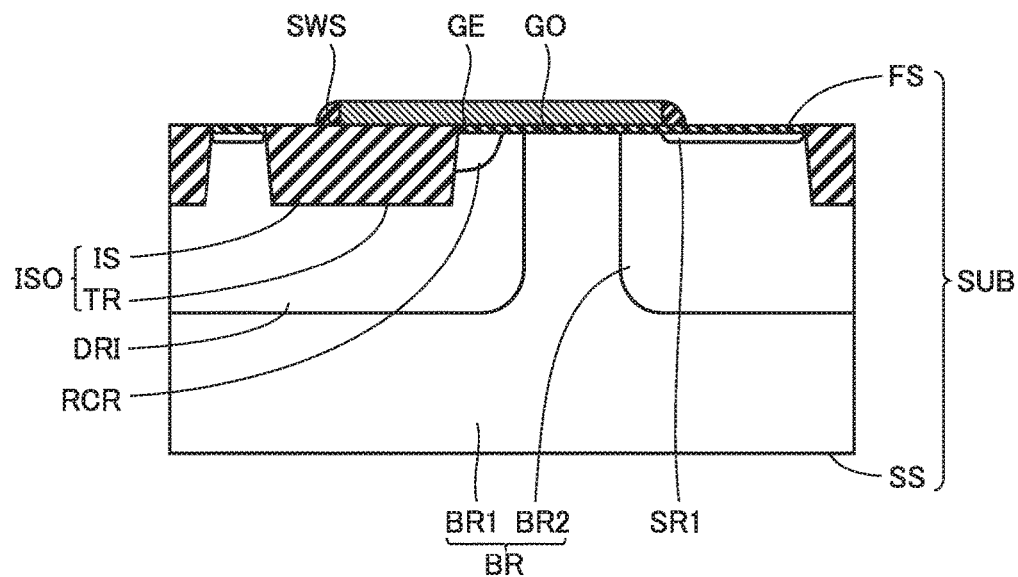
FIG. 13 is a cross-sectional view of the semiconductor device according to the first embodiment in a sidewall formation step.

As shown in FIG. 13, in sidewall spacer formation step S17, sidewall spacer SWS is formed. Sidewall spacer formation step S17 has a deposition step S171 and an etching step S172 for example. In deposition step S171, a material which composes sidewall spacer SWS is deposited on gate insulating film GO.

Etching step S172 is performed after deposition step S171. In etching step S172, sidewall spacer SWS deposited on gate insulating film GO is etched. This forms sidewall spacer SWS at opposite ends of gate electrode GE.

Figure 14:
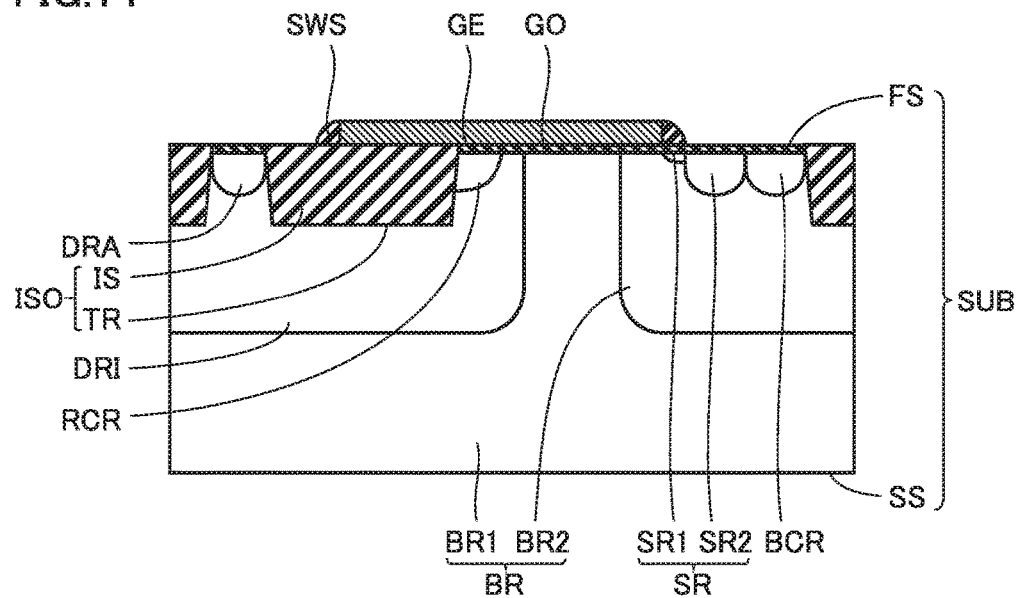
FIG. 14 is a cross-sectional view of the semiconductor device according to the first embodiment in a fourth implantation step.

As shown in FIG. 14, in fourth implantation step S18, source region SR, drain region DRA, and body contact region BCR are formed. Source region SR, drain region DRA, and body contact region BCR are formed by ion implantation. This ion implantation is done with gate electrode GE, sidewall spacer SWS, photoresist, and insulating isolation structure ISO used as a mask. This completes a method for manufacturing a semiconductor device according to the first embodiment.

While in the above description reverse conductivity region RCR is formed after body region BR and drift region DRI are formed, reverse conductivity region RCR may be formed before body region BR and drift region DRI are formed. While in the above description reverse conductivity region RCR is formed before insulating isolation structure ISO is formed, reverse conductivity region RCR may be formed after insulating isolation structure ISO is formed.

Figure 15:
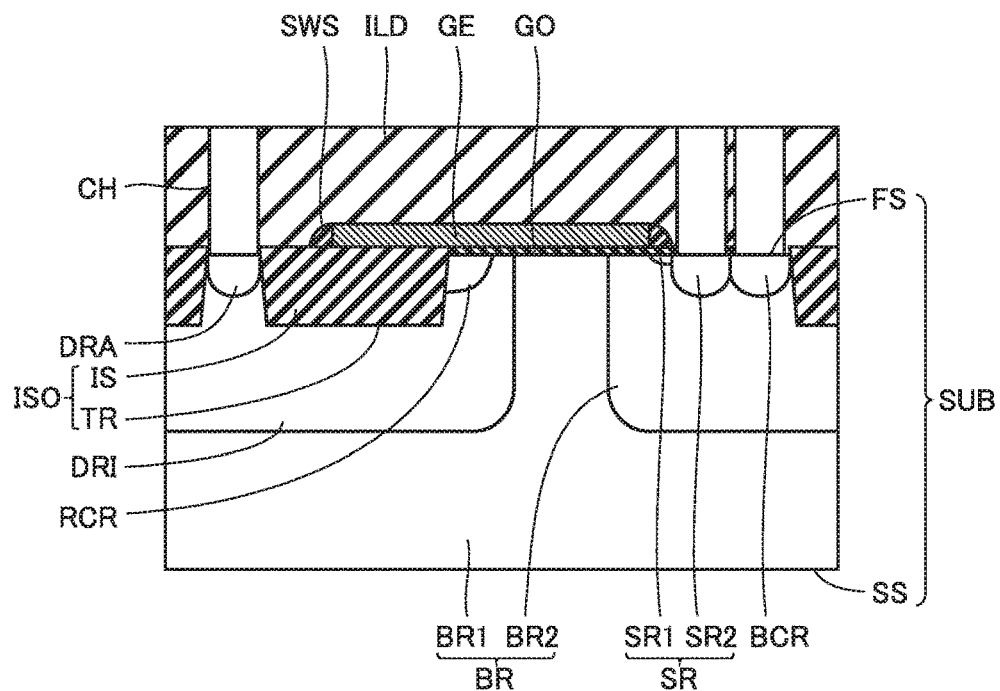
FIG. 15 is a cross-sectional view of the semiconductor device according to the first embodiment in an interlayer insulation film formation step.

As shown in FIG. 15, in interlayer insulating film formation step S21, interlayer insulating film ILD is formed. In interlayer insulating film formation step S21, interlayer insulating film ILD is initially deposited. Interlayer insulating film ILD is deposited for example by CVD. Subsequently, in interlayer insulating film formation step S21, contact hole CH is formed. Contact hole CH is formed for example by anisotropic etching such as RIE.

Figure 16:
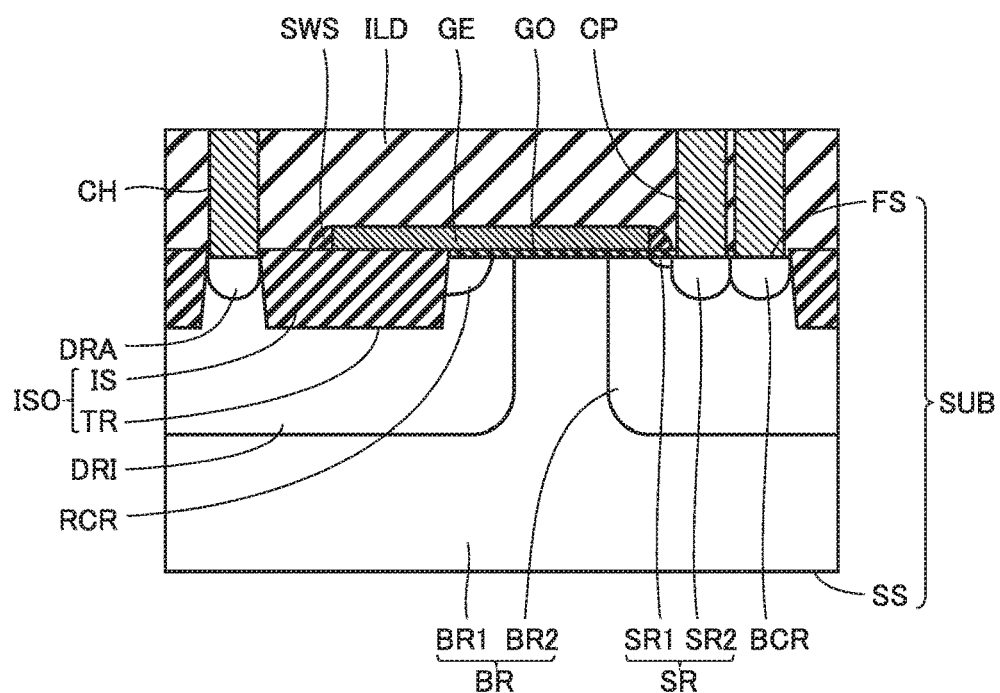
FIG. 16 is a cross-sectional view of the semiconductor device according to the first embodiment in a contact plug formation step.

As shown in FIG. 16, in contact plug formation step S22, contact plug CP is formed. Contact plug CP is formed for example by filling contact hole CH by CVD with a material which composes contact plug CP.

In wiring formation step S23, wiring WL is formed. In wiring formation step S23, a material which composes wiring WL is initially deposited on interlayer insulating film ILD. Subsequently, in wiring formation step S23, the material deposited on interlayer insulating film ILD and composing wiring WL is patterned. This patterning is done through photolithography for example. Thus, the structure of the semiconductor device according to the first embodiment shown in FIG. 2 is formed.

Hereinafter, an effect of the semiconductor device according to the first embodiment will be described.

As has been described above, reverse conductivity region RCR and drift region DRI are opposite in conductivity, and accordingly, a depletion layer is formed by a pn junction between reverse conductivity region RCR and drift region DRI. This depletion layer alleviates an electric field in semiconductor substrate SUB located immediately under gate insulating film GO. Accordingly, when the first conductivity type is the p type (and the second conductivity type is the n type), generated hot carriers are less likely to be accelerated toward gate insulating film GO.

Furthermore, when the first conductivity type is the p type (and the second conductivity type is the n type), generated hot carriers are coulomb-scattered by carriers existing in reverse conductivity region RCR. For this reason, generated hot carriers do not easily reach gate insulating film GO. Thus the semiconductor device of the first embodiment can suppress degradation of gate insulating film GO caused due to hot carrier injection and can thus be more reliable.

In the semiconductor device according to the first embodiment, a current which flows between drain region DRA and source region SR passes directly under insulating isolation structure ISO and goes toward source region SR. However, in the semiconductor device according to the first embodiment, first depth D1 is deeper than second depth D2. Accordingly, reverse conductivity region RCR is less likely to be an obstacle against this current. Thus the semiconductor device according to the first embodiment can suppress reduction of the amount of the current and also be more reliable.

Figure 17:
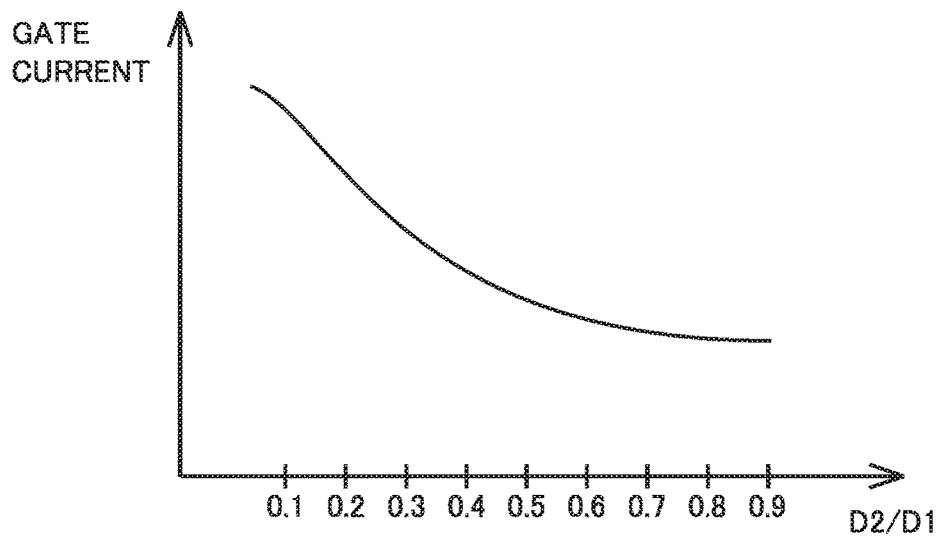
FIG. 17 is a graph representing a relationship between a gate current and a ratio of a second depth to a first depth.

As shown in FIG. 17, as second depth D2 increases, a gate current decreases (that is, hot carrier injection decreases). However, once second depth D2 has reached first depth D1 multiplied by 0.7, second depth D2 increased is less likely to cause further reduction in the gate current (that is, further reduction in hot carrier injection). Furthermore, when second depth D2 exceeds first depth D1 multiplied by 0.7, the depletion layer formed by the pn junction between reverse conductivity region RCR and drift region DRI extends deeply toward second surface SS, which may result in an increased ON resistance. The semiconductor device according to the first embodiment with second depth D2 equal to or greater than first depth D1 multiplied by 0.3 and equal to or less than first depth D1 multiplied by 0.7, can be further more reliable while suppressing ON resistance.

As reverse conductivity region RCR has an impurity concentration larger than that of drift region DRI, the depletion layer extends more toward drift region DRI. Furthermore, as reverse conductivity region RCR has an impurity concentration larger than that of drift region DRI, coulomb scattering in reverse conductivity region RCR is further more likely to occur. Accordingly, the semiconductor device according to the first embodiment with reverse conductivity region RCR having an impurity concentration equal to or greater than 10 times that of drift region DRI, can be further more reliable.

As has been discussed above, carriers in reverse conductivity region RCR cause Coulomb scattering with hot carriers. This may dissipate carriers in reverse conductivity region RCR and reduce an effect of Coulomb scattering to suppress hot carrier injection. The semiconductor device according to the first embodiment with reverse conductivity region RCR electrically connected to source region SR and body contact region BCR has reverse conductivity regions RCR equal in potential to source region SR and body contact region BCR and accordingly, the reverse conductivity region is compensated for dissipated carriers. Thus, in this case, the effect of Coulomb scattering to suppress hot carrier injection can be maintained, and the semiconductor device can be further more reliable.

(Second Embodiment)

Hereinafter, a configuration of a semiconductor device according to a second embodiment will be described. In the following, differences from the semiconductor device according to the first embodiment will mainly be described, and redundant description will not be repeated.

Figure 18:
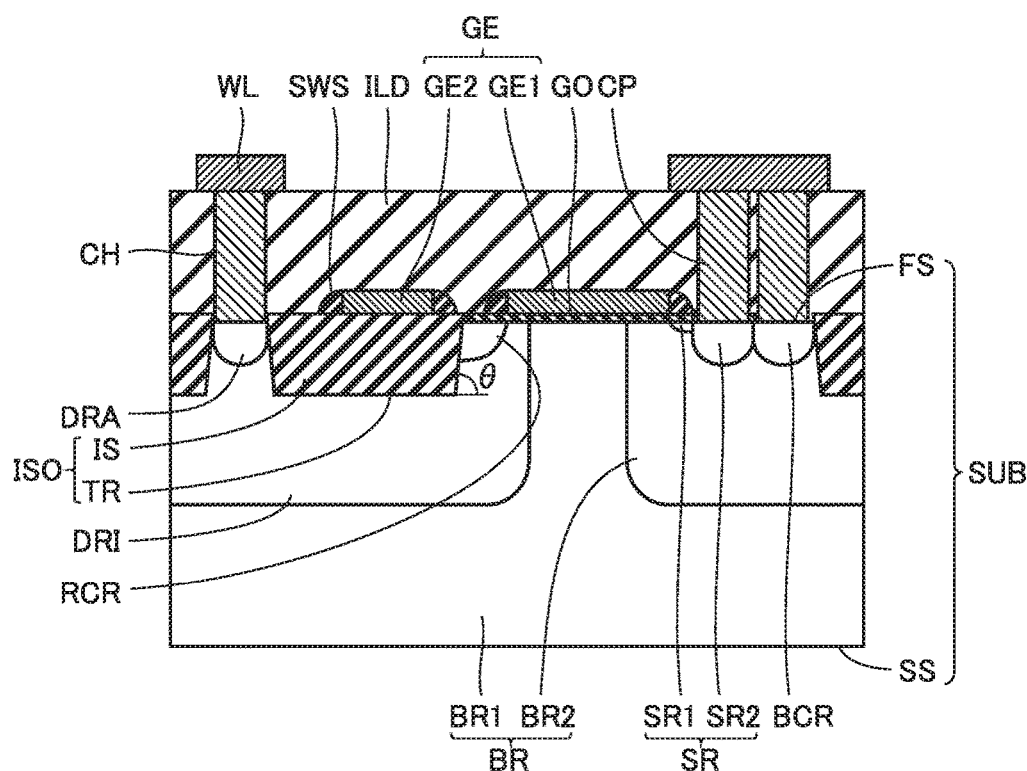
FIG. 18 is a cross-sectional view of a semiconductor device according to a second embodiment.

As shown in FIG. 18, the semiconductor device according to the second embodiment has semiconductor substrate SUB, insulating isolation structure ISO, gate insulating film GO, gate electrode GE, interlayer insulating film ILD, contact plug CP, and wiring WL.

Semiconductor substrate SUB has source region SR, drain region DRA, and reverse conductivity region RCR. Semiconductor substrate SUB may further have body contact region BCR. Semiconductor substrate SUB has first surface FS and second surface SS. In these points, the semiconductor device according to the second embodiment is common with the semiconductor device according to the first embodiment.

In the semiconductor device according to the second embodiment, gate electrode GE has a first portion GE1 and a second portion GE2. In the semiconductor device according to the second embodiment, insulating isolation structure ISO is STI. In these points, the semiconductor device according to the second embodiment is different from the semiconductor device according to the first embodiment.

First portion GE1 is disposed to face a portion of body region BR sandwiched between source region SR and drift region DRI and be insulated from the portion by gate insulating film GO. Second portion GE2 is disposed on insulating isolation structure ISO. First portion GE1 and second portion GE2 are spaced from each other. In other words, a spacing is provided between first portion GE1 and an end of insulating isolation structure ISO closer to source region SR. Reverse conductivity region RCR is located between first portion GE1 and second portion GE2.

In the semiconductor device according to the second embodiment, insulating isolation structure ISO is STI. From another point of view, insulating isolation structure ISO has trench TR and insulator IS. Trench TR is formed in first surface FS. Trench TR extends toward second surface SS. Trench TR has a sidewall having a taper angle θ. Taper angle θ is an angle which the sidewall and bottom surface of trench TR form. Preferably, taper angle θ is 75 degrees or more and 90 degrees or less. Insulator IS fills trench TR.

Hereinafter, a method for manufacturing a semiconductor device according to the second embodiment will be described. In the following, differences from the method for manufacturing a semiconductor device according to the first embodiment will mainly be described, and redundant description will not be repeated.

Figure 19:
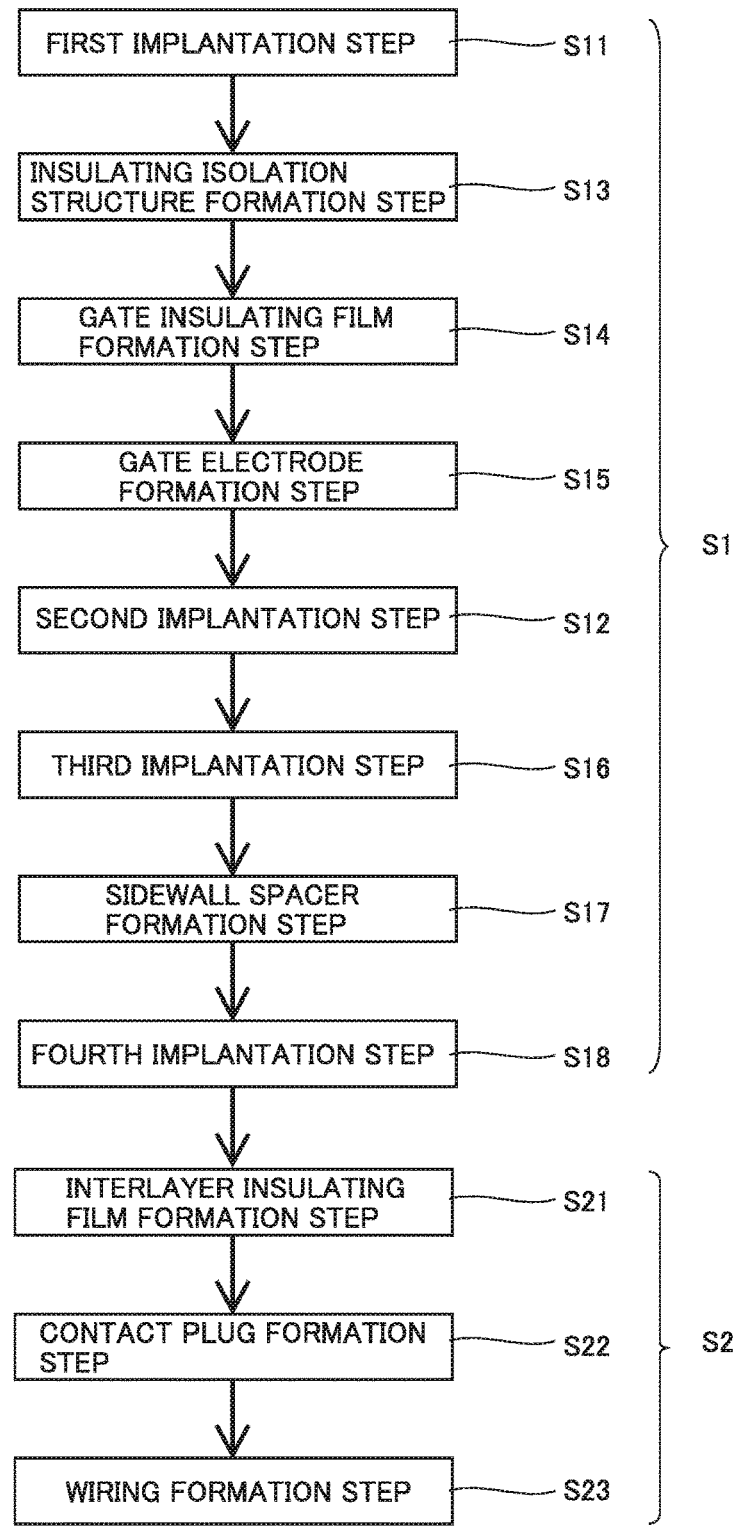
FIG. 19 is a process diagram showing a method for manufacturing the semiconductor device according to the second embodiment.

As shown in FIG. 19, the method for manufacturing a semiconductor device according to the second embodiment has front end step S1 and back end step S2. In the semiconductor manufacturing method according to the second embodiment, front end step S1 has first implantation step S11, second implantation step S12, insulating isolation structure formation step S13, gate insulating film formation step S14, gate electrode formation step S15, third implantation step S16, sidewall spacer formation step S17, and fourth implantation step S18.

In the method for manufacturing a semiconductor device according to the second embodiment, back end step S2 has interlayer insulating film formation step S21, contact plug formation step S22, and wiring formation step S23. In these points, the method for manufacturing a semiconductor device according to the second embodiment is similar to the method for manufacturing a semiconductor device according to the first embodiment.

Figure 20:
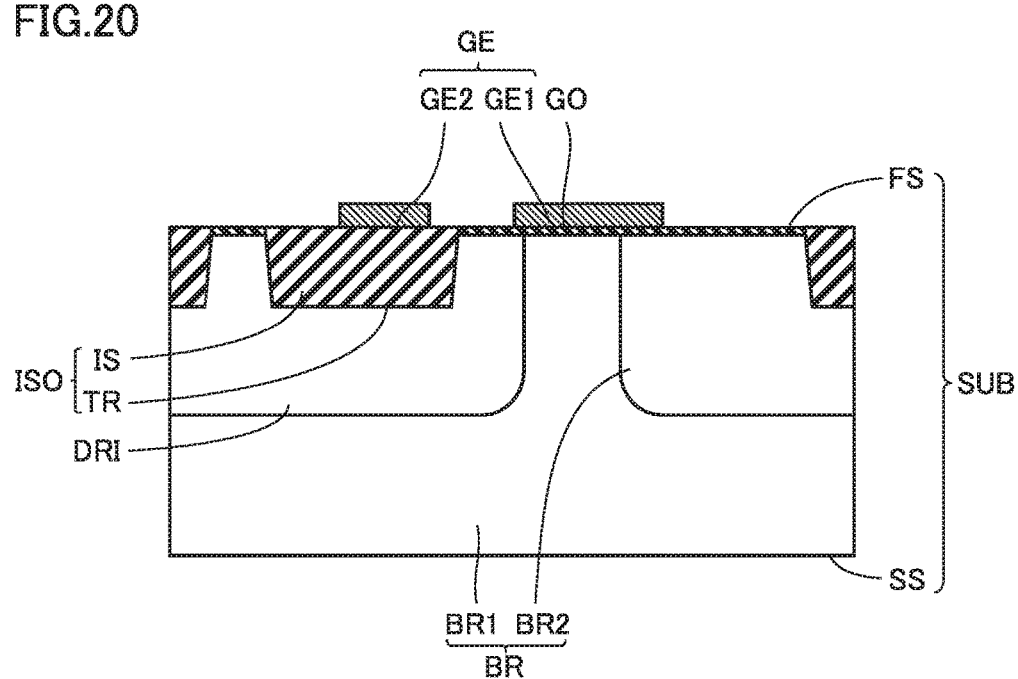
FIG. 20 is a cross-sectional view of the semiconductor device according to the second embodiment in a gate electrode formation step.

In the method for manufacturing a semiconductor device according to the second embodiment, as shown in FIG. 20, in gate electrode formation step S15, gate electrode GE is formed to have first portion GE1 and second portion GE2. In the method for manufacturing a semiconductor device according to the second embodiment, second implantation step S12 is performed after insulating isolation structure formation step S13, gate insulating film formation step S14, and gate electrode formation step S15. In these points, the method for manufacturing a semiconductor device according to the second embodiment is different from the method for manufacturing a semiconductor device according to the first embodiment.

Figure 21:
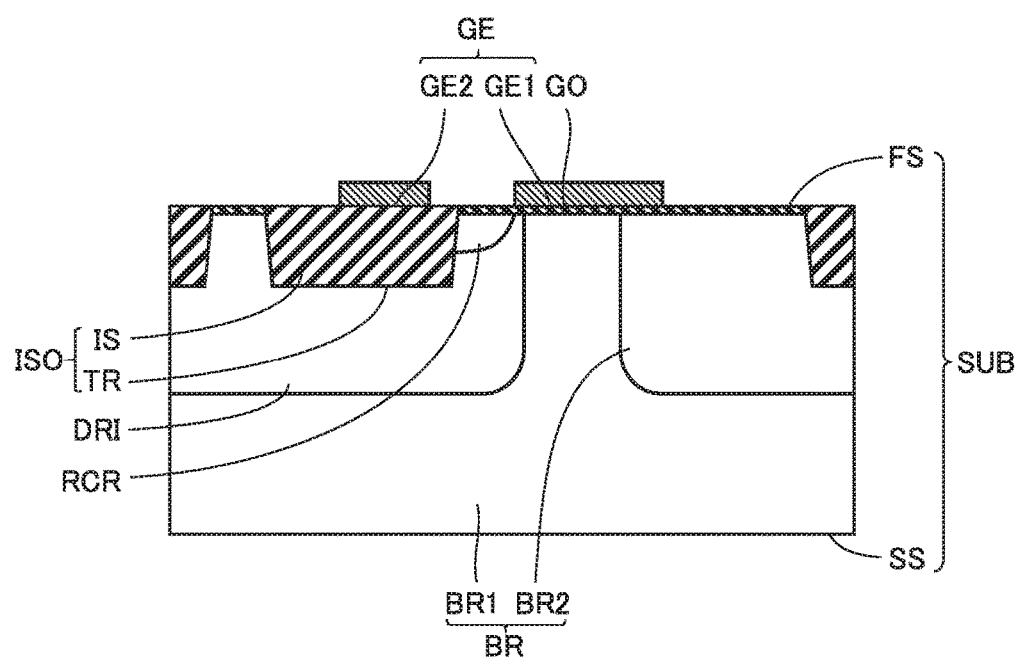
FIG. 21 is a cross-sectional view of the semiconductor device according to the second embodiment in a second implantation step.

As shown in FIG. 21, in second implantation step S12, reverse conductivity region RCR is formed. Reverse conductivity region RCR is formed by ion implantation. This ion implantation is performed with first portion GE1, insulating isolation structure ISO, and photoresist used as a mask. In other words, reverse conductivity region RCR is formed by self alignment.

In the method for manufacturing a semiconductor device according to the second embodiment, second implantation step S12 may be performed after sidewall spacer formation step S17 or before sidewall spacer formation step S17.

Furthermore, in the method for manufacturing a semiconductor device according to the second embodiment, second implantation step S12 may be performed simultaneously with or separately from third implantation step S16. Furthermore, in the method for manufacturing a semiconductor device according to the second embodiment, second implantation step S12 may be performed simultaneously with, before, or after fourth implantation step S18. Second implantation step S12 may be performed simultaneously with both third implantation step S16 and fourth implantation step S18.

Hereinafter, an effect of the semiconductor device according to the second embodiment will be described by comparing it with a comparative example.

Figure 22:
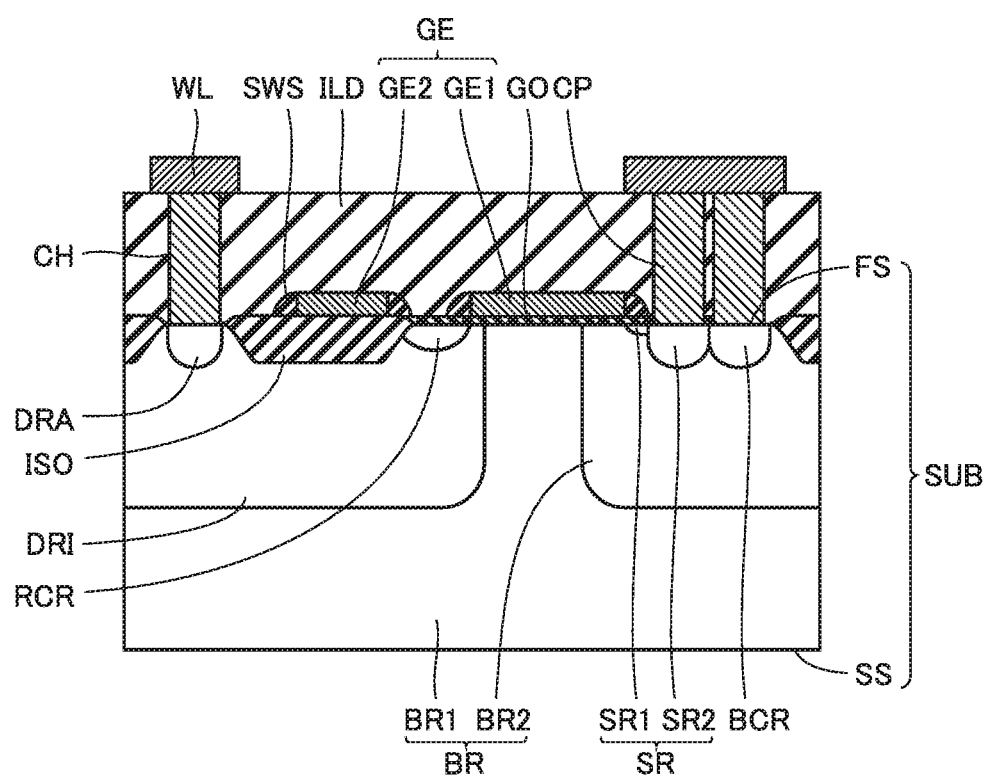
FIG. 22 is a cross-sectional view of a semiconductor device according to a comparative example.

As shown in FIG. 22, a semiconductor device according to the comparative example has semiconductor substrate SUB, insulating isolation structure ISO, gate insulating film GO, gate electrode GE, interlayer insulating film ILD, contact plug CP, and wiring WL. Semiconductor substrate SUB has source region SR, drain region DRA, reverse conductivity region RCR, and body contact region BCR. Semiconductor substrate SUB has first surface FS and second surface SS. In the semiconductor device according to the comparative example, insulating isolation structure ISO is LOCOS. In the semiconductor device according to the comparative example, gate electrode GE has first portion GE1 and second portion GE2. That is, the semiconductor device according to the comparative example has the same structure as the semiconductor device according to the second embodiment, except that insulating isolation structure ISO is a LOCOS.

The LOCOS inevitably has a bird's beak formed at an end thereof. It is known that at the bird's beak the LOCOS has a significant variation in shape. From another viewpoint, in the semiconductor device according to the comparative example, insulating isolation structure ISO at an end is smaller in thickness than insulating isolation structure ISO at a center and has a significant variation in thickness.

As such, in the semiconductor device according to the comparative example, when reverse conductivity region RCR is formed by ion implantation using first portion GE1 and insulating isolation structure ISO as a mask, implanted ions reach or fail to reach semiconductor substrate SUB as insulating isolation structure ISO at an end is small in thickness and has a significant variation in thickness. As a result, reverse conductivity region RCR varies in shape. When reverse conductivity region RCR varies in shape the semiconductor device will vary in reliability.

In contrast, the semiconductor device according to the second embodiment has insulating isolation structure ISO formed of STI. When insulating isolation structure ISO is formed of STI it is less likely to have an end with a small thickness and also has the end with a thickness having a limited variation. Thus the semiconductor device according to the second embodiment having reverse conductivity region RCR formed with precision by self alignment less varies in reliability.

The semiconductor device according to the second embodiment with taper angle θ of 75 degrees or more and 90 degrees or less can further suppress variation of reverse conductivity region RCR in shape and thus further less vary in reliability.

While embodiments of the present invention have been described, it should be understood that the embodiments disclosed herein have been described for the purpose of illustration only and in a non-restrictive manner in any respect. The scope of the present invention is defined by the terms of the claims, rather than the description above, and is intended to include any modifications within the meaning and scope equivalent to the terms of the claims.

What is claimed is:

1. A semiconductor device comprising:
a semiconductor substrate having a first surface;
an insulating isolation structure disposed at a side of the first surface and composed of an insulator having a first depth; and
a gate electrode,
the semiconductor substrate having a source region disposed in contact with the first surface, a drain region disposed in contact with the first surface, a reverse conductivity region disposed in contact with the first surface and having a second depth, a body region disposed in contact with the first surface so as to surround the source region, and a drift region disposed in contact with the first surface so as to surround the drain region and the reverse conductivity region and sandwich the body region between the source region and the drift region,
the source region, the drift region, and the drain region being of a first conductivity type,
the body region and the reverse conductivity region being of a second conductivity type which is opposite to the first conductivity type,
the reverse conductivity region being disposed between the source region and the drain region,
the insulating isolation structure being disposed between the drain region and the reverse conductivity region,
the gate electrode facing and being insulated from a portion of the body region which is sandwiched by the source region and the drift region,
the first depth being larger than the second depth.

2. The semiconductor device according to claim 1, wherein the second depth is equal to or greater than the first depth multiplied by 0.3 and equal to or less than the first depth multiplied by 0.7.

3. The semiconductor device according to claim 1, wherein the reverse conductivity region has an impurity concentration equal to or greater than 10 times that in the drift region.

4. The semiconductor device according to claim 1, wherein the reverse conductivity region is electrically connected to the source region.

5. A semiconductor device comprising:
a semiconductor substrate having a first surface and a second surface which is a surface opposite to the first surface;
an insulating isolation structure disposed at a side of the first surface and composed of an insulator; and
a gate electrode,
the semiconductor substrate having a source region disposed in contact with the first surface, a drain region disposed in contact with the first surface, a reverse conductivity region disposed in contact with the first surface, a body region disposed in contact with the first surface so as to surround the source region, and a drift region disposed in contact with the first surface so as to surround the drain region and the reverse conductivity region and sandwich the body region between the source region and the drift region,
the source region, the drift region, and the drain region being of a first conductivity type,
the body region and the reverse conductivity region being of a second conductivity type which is opposite to the first conductivity type,
the reverse conductivity region being disposed between the source region and the drain region,
the semiconductor substrate having a trench disposed between the drain region and the reverse conductivity region and extending from the first surface toward the second surface,
the gate electrode facing and being insulated from a portion of the body region which is sandwiched by the source region and the drift region,
the insulating isolation structure being composed of the trench and the insulator filling the trench.

6. The semiconductor device according to claim 5, wherein a taper angle, which is an angle formed by a sidewall of the trench and the first surface, is 75 degrees or more and 90 degrees or less.

7. The semiconductor device according to claim 5, wherein
the insulating isolation structure has a first depth,
the reverse conductivity region has a second depth, and
the first depth is larger than the second depth.

8. The semiconductor device according to claim 7, wherein the second depth is equal to or greater than the first depth multiplied by 0.3 and equal to or less than the first depth multiplied by 0.7.

9. The semiconductor device according to claim 5, wherein the reverse conductivity region has an impurity concentration equal to or greater than 10 times that in the drift region.

10. The semiconductor device according to claim 5, wherein the reverse conductivity region is electrically connected to the source region.

* * * * *